(12) United States Patent
Brazeau et al.

(10) Patent No.: US 10,694,617 B2
(45) Date of Patent: Jun. 23, 2020

(54) PLASTIC INJECTION MOLDED POTTING CUPS AND RELATED METHODS

(71) Applicant: Sensus Spectrum, LLC, Morrisville, NC (US)

(72) Inventors: Michael David Brazeau, Raleigh, NC (US); Benjamin John Sokol, Carrboro, NC (US)

(73) Assignee: Sensus Spectrum, LLC, Morrisville, NC (US)

( * ) Notice: Subject to any disclaimer, the term of this patent is extended or adjusted under 35 U.S.C. 154(b) by 0 days.

(21) Appl. No.: 16/050,242

(22) Filed: Jul. 31, 2018

(65) Prior Publication Data

US 2020/0045805 A1    Feb. 6, 2020

(51) Int. Cl.
*H05K 1/02* (2006.01)
*H05K 3/22* (2006.01)

(52) U.S. Cl.
CPC ............. *H05K 1/02* (2013.01); *H05K 3/22* (2013.01); *H05K 2201/10409* (2013.01); *H05K 2203/1305* (2013.01)

(58) Field of Classification Search
CPC .. H05K 1/02; H05K 3/22; H05K 2201/10409; H05K 2203/1305
USPC ........................................................ 174/250
See application file for complete search history.

(56) References Cited

U.S. PATENT DOCUMENTS

| | | |
|---|---|---|
| D314,371 S | 2/1991 | Matsui |
| D315,334 S | 3/1991 | Fujioka |
| 5,278,426 A * | 1/1994 | Barbier ............... G01F 23/2925 250/577 |
| D401,590 S | 11/1998 | Tajima et al. |
| D519,470 S | 4/2006 | Hahn et al. |
| D768,097 S | 10/2016 | Powers |
| D790,492 S | 6/2017 | Chaivoraporn et al. |
| D839,827 S | 2/2019 | Stoner |
| 2008/0165511 A1 | 7/2008 | Mayuzumi et al. |
| 2012/0219257 A1* | 8/2012 | Meadowcroft ...... H05K 1/0274 385/93 |
| 2014/0160363 A1* | 6/2014 | Mutschelknaus ..... G09F 27/008 348/799 |
| 2014/0160699 A1 | 6/2014 | Zhang et al. |

FOREIGN PATENT DOCUMENTS

| | | |
|---|---|---|
| EP | 1 314 169 A1 | 5/2003 |
| WO | WO 02/09124 A1 | 1/2002 |

OTHER PUBLICATIONS

Notification of Transmittal of the International Search Report and the Written Opinion of the International Searching Authority, or the Declaration.

* cited by examiner

*Primary Examiner* — Tremesha S Willis
(74) *Attorney, Agent, or Firm* — Stanek Lemon Crouse & Meeks, P.A.

(57) ABSTRACT

A potting cup is provided and is positioned on a printed circuit board. The potting cup encapsulates a portion of the printed circuit board including at least one interface subject to corrosion when exposed to moisture and is configured to receive a potting material in the encapsulated portion to cover the at least one interface subject to corrosion.

19 Claims, 10 Drawing Sheets

| PRE MFG Ω | | POST MFG Ω | | PCB TYPE | CASE SCREW TYPE | PCB SCREW TYPE | PCB WASHER TYPE | FRONT CASE TYPE | SEAL TYPE | | PCB DELTA | CASE DELTA |
|---|---|---|---|---|---|---|---|---|---|---|---|---|
| PCB | CASE | PCB | CASE | | | | | | | | | |
| 0.006 | 0.005 | 0.006 | 0.005 | PCB | GEOMET | SS | SS | POST-DRILL | POTTED | | 0 | 0 |
| 0.006 | 0.006 | 0.006 | 0.006 | PCB | GEOMET | SS | SS | POST-DRILL | POTTED | SALT | 0 | 0 |
| 0.006 | 0.005 | 0.007 | 0.005 | PCB | GEOMET | SS | SS | PRE-DRILL | POTTED | | 0.001 | 0.000 |
| 0.005 | 0.005 | 0.006 | 0.006 | PCB | GEOMET | SS | SS | POST-DRILL | POTTED | | 0.001 | 0.001 |
| 0.006 | 0.005 | 0.007 | 0.006 | PCB | GEOMET | SS | SS | POST-DRILL | POTTED | | 0.001 | 0.001 |

FIG. 9

PLASTIC INJECTION MOLDED POTTING CUPS AND RELATED METHODS

FIELD

The present inventive concept relates generally to printed circuit boards and, more particularly, to controlling corrosion of metals on and in contact with printed circuit boards.

BACKGROUND

Corrosion is a problem with electrical equipment where metals are present. For example, galvanic corrosion trying to bridge the electro potentials of metals on a printed circuit board. The potential for corrosion can be reduced by keeping moisture away from the metals on the printed circuit board. Maintaining a consistent ground path from the printed circuit board ground plane to a metal case of a device is important to performance over the life of the device.

SUMMARY

Some embodiments of the present inventive concept provide a potting cup positioned on a printed circuit board. The potting cup encapsulates a portion of the printed circuit board including at least one interface subject to corrosion when exposed to moisture and is configured to receive a potting material in the encapsulated portion to cover the at least one interface subject to corrosion.

In further embodiments, the potting cup may be configured to encapsulate an upper surface, a lower surface and edges of a single corner of the printed circuit board.

In still further embodiments, the at least one interface may include a screw printed circuit board interface and the potting material may be provided at the interface between a screw head and an upper surface of the printed circuit board and a screw boss and a lower surface of the printed circuit board such that the potting material fully covers the screw head.

In some embodiments, presence of the potting material on the at least one interface subject to corrosion may provide a consistent ground path from a ground plane of the printed circuit board to a metal case of a device associated with the printed circuit board.

In further embodiments, the potting cup may be a plastic injection molded potting cup.

In still further embodiments, the potting cup may be one of a translucent and clear plastic material.

In some embodiments, the potting material may include a silicone gel.

In further embodiments, when positioned on the printed circuit board, the potting cup may include a space between surfaces of the printed circuit board and the potting cup to allow air to escape during application of the potting material.

In still further embodiments, the printed circuit board may be positioned in an ultrasonic gas meter that includes a radio communications module therein.

Some embodiments of the present inventive concept provide a method for potting a selected portion of a printed circuit board, the method including positioning a potting cup on a printed circuit board such that the potting cup encapsulates a portion of the printed circuit board including at least one interface subject to corrosion when exposed to moisture; injecting a potting material into the potting cup positioned on the printed circuit board to cover the at least one interface subject to corrosion; and removing air bubbles from the injected potted material using a vacuum chamber.

BRIEF DESCRIPTION OF THE DRAWINGS

FIG. 9 is a table illustrating resistivity results in accordance with some embodiments of the present inventive concept.

DETAILED DESCRIPTION

Figure 1:
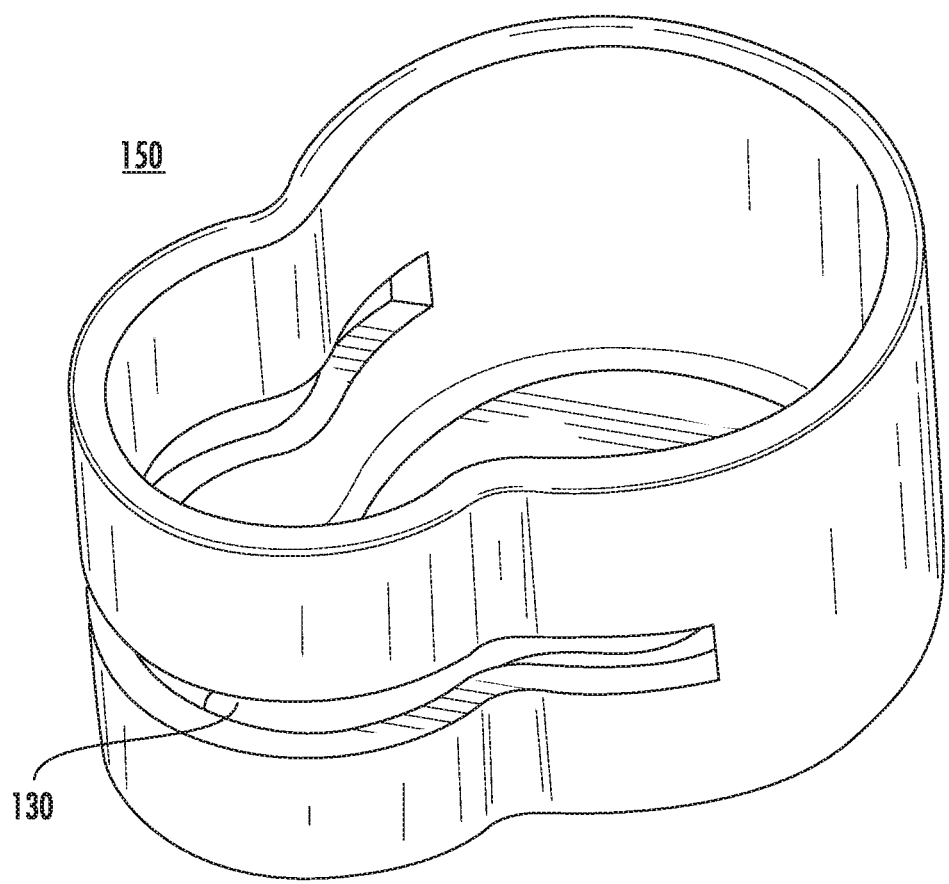
FIG. 1 is a diagram of a potting cup in accordance with some embodiments of the present inventive concept.

The present inventive concept will be described more fully hereinafter with reference to the accompanying figures, in which embodiments of the inventive concept are shown. This inventive concept may, however, be embodied in many alternate forms and should not be construed as limited to the embodiments set forth herein.

Accordingly, while the inventive concept is susceptible to various modifications and alternative forms, specific embodiments thereof are shown by way of example in the drawings and will herein be described in detail. It should be understood, however, that there is no intent to limit the inventive concept to the particular forms disclosed, but on the contrary, the inventive concept is to cover all modifications, equivalents, and alternatives falling within the spirit and scope of the inventive concept as defined by the claims. Like numbers refer to like elements throughout the description of the figures.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises", "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof. Moreover, when an element is referred to as being "responsive" or "connected" to another element, it can be directly responsive or connected to the other element, or intervening elements may be present. In contrast, when an element is referred to as being "directly responsive" or "directly connected" to another element, there are no intervening elements present. As used herein the term "and/or" includes any and all combinations of one or more of the associated listed items and may be abbreviated as "/".

Unless otherwise defined, all terms (including technical and scientific terms) used herein have the same meaning as commonly understood by one of ordinary skill in the art to which this inventive concept belongs. It will be further understood that terms used herein should be interpreted as having a meaning that is consistent with their meaning in the context of this specification and the relevant art and will not be interpreted in an idealized or overly formal sense unless expressly so defined herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element without departing from the teachings of the disclosure.

As used herein, an "interface subject to corrosion" refers to anywhere two distinct metals subject to corrosion meet. For example, an interface between gold, a steel screw and an aluminum device case. Thus, although embodiments herein refer to a steel screw as the relevant interface, embodiments of the present inventive concept are not limited thereto.

As discussed above, maintaining a consistent ground path from a printed circuit board (PCB) to, for example, a metal case of a device is important to maintain performance over the life of the device. Corrosion of metals associated with the PCB could cause bridging of traces on the PCB and, therefore, lead to corruption of the PCB and poor performance or failure of the device(s) associated therewith. Thus, conventional PCBs may have a potting material over full surfaces of the PCB. The presence of the potting material may reduce the likelihood of corrosion associated with metals thereon.

However, on PCBs having radio communication modules thereon, the presence of the potting material over the radio communication modules on the PCB may affect the signal produced by the radio communication modules resulting in poor performance thereof. Accordingly, embodiments of the present inventive concept provide a custom potting cup designed to encapsulate only those portions of the PCB that are likely subject to corrosion. The presence of the potting cup on these selected portions of the PCB allows a potting material to formed only on those portions subject to corrosion and may leave the radio communication modules free of the potting material. Thus, selective potting as discussed herein may allow improved performance of the radio communication modules on the PCBs as will be discussed further with respect to FIGS. 1 through 10 below.

Referring now to FIG. 1, a potting cup in accordance with embodiments of the present inventive concept will be discussed. As illustrated in FIG. 1, the potting cup 150 includes a slot 130 that is designed such that the potting cup 150 can be positioned on a PCB. A portion of the potting cup 150 is above an upper surface of the PCB and a portion of the potting cup is below a lower surface of the PCB as shown in, for example, FIG. 2. In some embodiments, the potting cup 150 is a plastic injection molded potting cup. However, embodiments of the present inventive concept are not limited to this configuration. For example, any material suitable for a potting cup may be used without departing from the scope of the present inventive concept. The material used should be a material that will not affect functionality of the electronics on the PCB and may be translucent or clear.

The potting cup 150 completely encapsulates all interfaces that are subject to corrosion such that the potting material may be formed thereon as will be discussed below. Although potting cups in accordance with embodiments discussed herein are designed to encapsulate a corner of the PCB and the potting cup 150 has a particular shape shown herein, embodiments of the present inventive concept are not limited to this configuration. Other shapes or more than one potting cup on a PCB may be used without departing from the scope of the present inventive concept.

Figure 2:
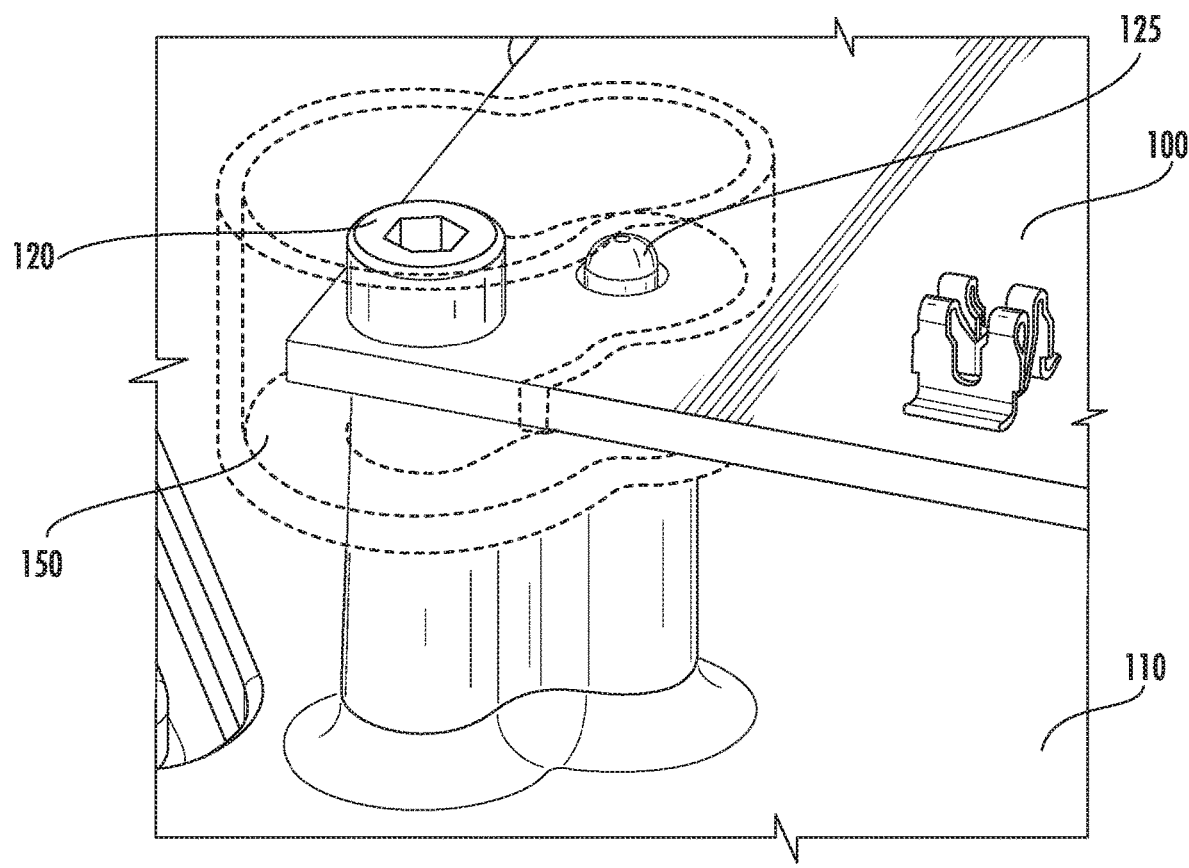
FIG. 2 is a perspective view of a potting cup positioned on a printed circuit board in accordance with some embodiments of the present inventive concept.
Figure 3:
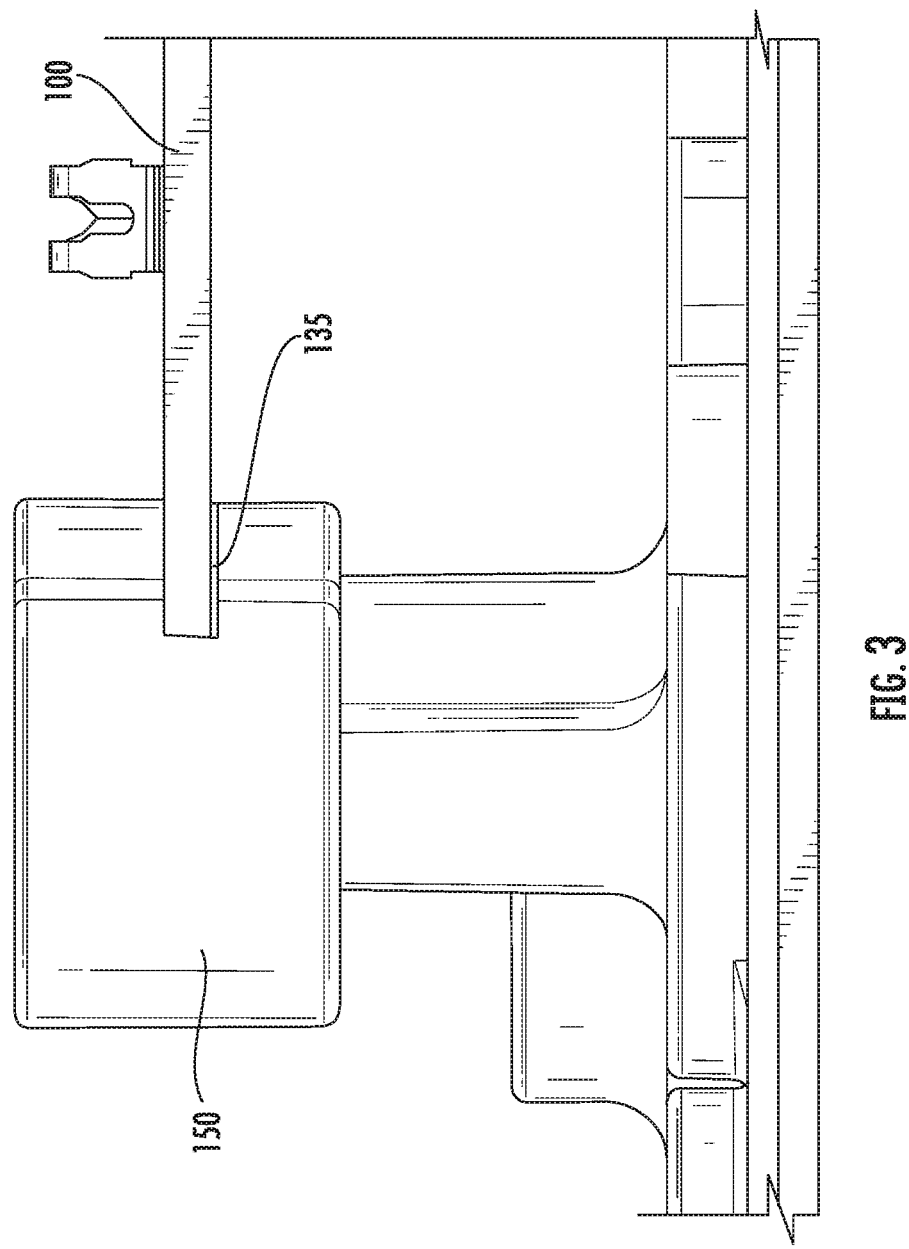
FIG. 3 is a side view of a potting cup positioned on a printed circuit board in accordance with some embodiments of the present inventive concept.
Figure 4:
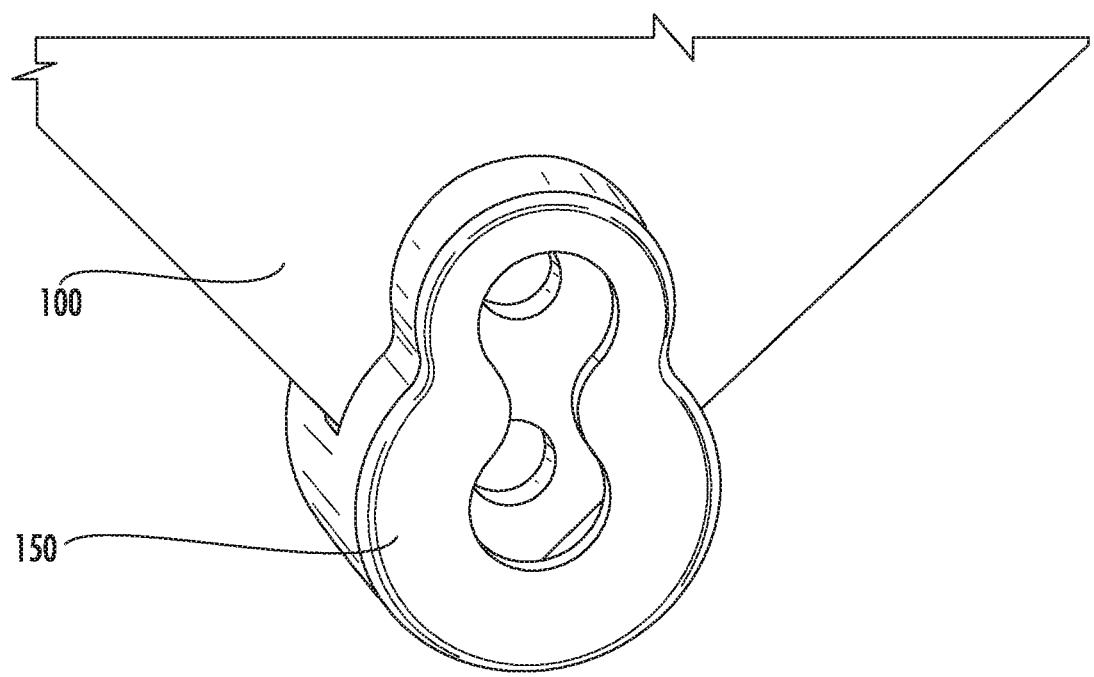
FIG. 4 is a perspective view of a potting cup positioned on a printed circuit board in accordance with some embodiments of the present inventive concept.

FIG. 2 illustrates a PCB having a plastic injection molded potting cup position thereon in accordance with some embodiments of the present inventive concept will be discussed. FIGS. 3 and 4 further illustrate side and bottom views thereof. As illustrated in FIG. 2, a PCB 100 is mounted to a metal case 110 using a screw 120 and an alignment pin 125. In some embodiments, the PCB 100 may be a PCB for use in an ultrasonic gas meter and may have radio communication modules thereon. However, embodiments of the present inventive concept are not limited to this configuration.

As further illustrated in FIG. 2, a potting cup 150 for example, a plastic injection molded potting cup, is provided on a corner of the PCB 100. As illustrated, the potting cup 150 slides onto the PCB 100 using the slot 130 (FIG. 1). The potting cup 150 is positioned above and below the PCB such that the screw 120 and the alignment pin 125 on a corner of the PCB 100 are encapsulated. As illustrated in FIG. 4, a bottom surface of the potting cup 150 is open to allow the screw 120 and the alignment pin 125 to extend therethrough. The potting cup illustrated in FIG. 1 is designed specifically to encapsulate a top, bottom, and edges of a single corner of the PCB 100. As will be discussed below, a potting material, such as a silicone gel, is injected into the potting cup 150 to cover the screw 120 and the alignment pin 125 such that the potting material covers at least the head of the screw and any other elements that may be present that need potting, i.e. only those interfaces that are subject to corrosion. For example, the potting material may only have a thickness of about 2-3 mm in some embodiments. A small space 135 (FIG. 3) remains between the potting cup 150 and the PCB 100 when the potting cup is positioned on the PCB 100. This space 135 allows the potting material to escape during the application of the potting material and, therefore, reducing the amount of air pockets in the final potting material. Using the potting cup to define a small area of the PCB to receive the potting material, allows the remaining portions of the PCB including radio communication modules to remain free of the potting material. Furthermore, only potting a portion of the PCB 100 may reduce cost, cure time and production time.

Although embodiments of the present inventive concept are discussed herein with respect to PCBs in ultrasonic gas meters having steel screws, embodiments of the present inventive concept are not limited to this configuration. For example, embodiments of the present inventive concept could be used on any PCB grounded to a metal case through a screw that is subject to corrosion due to exposure to moisture over time. Further, potting is generally used anywhere two distinct metals come together that are subject to corrosion.

Figure 5:
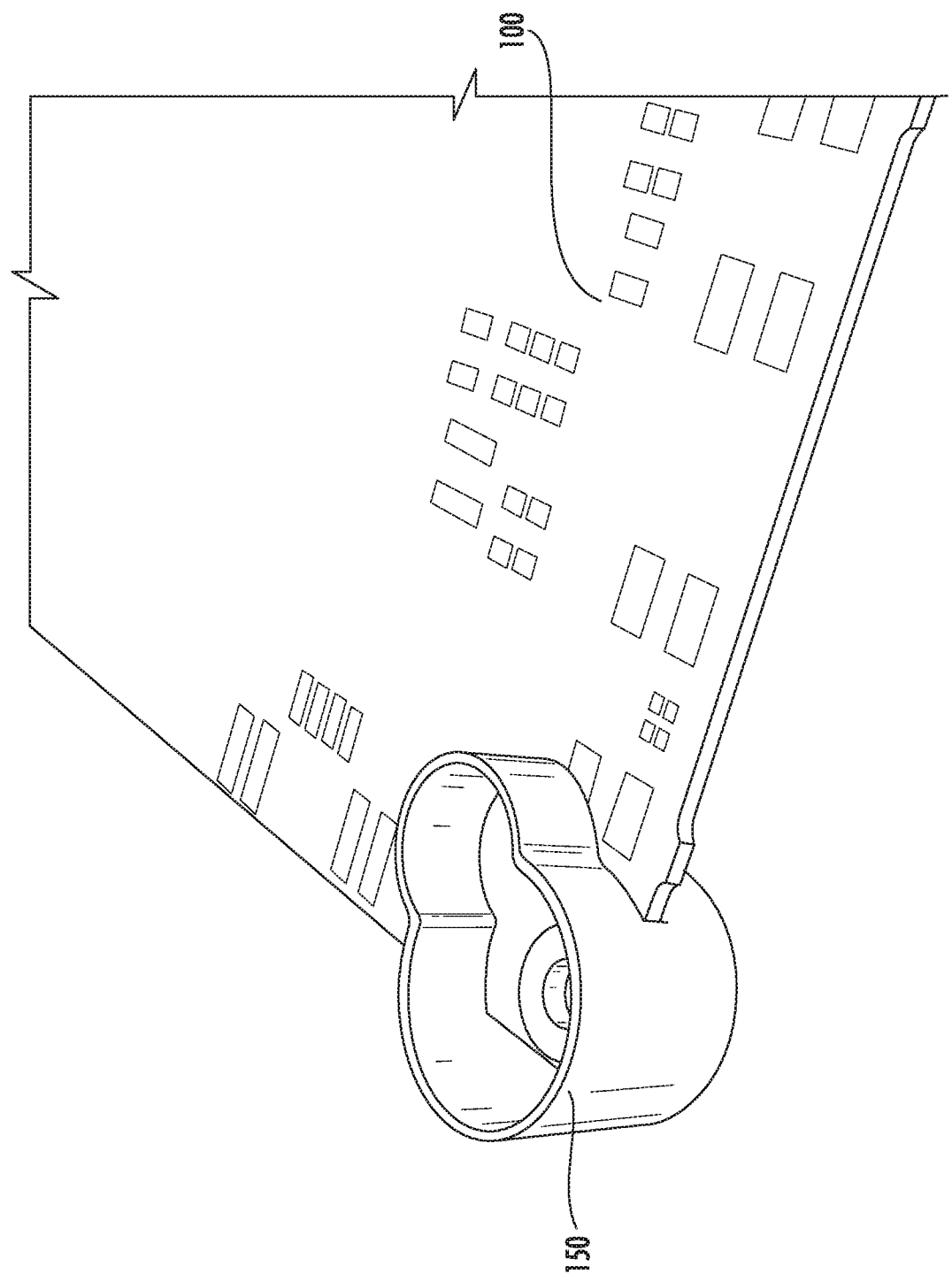
FIGS. 5 through 7 are diagrams illustrating application of the potting material in the potting cup in accordance with embodiments of the present inventive concept.
Figure 6:
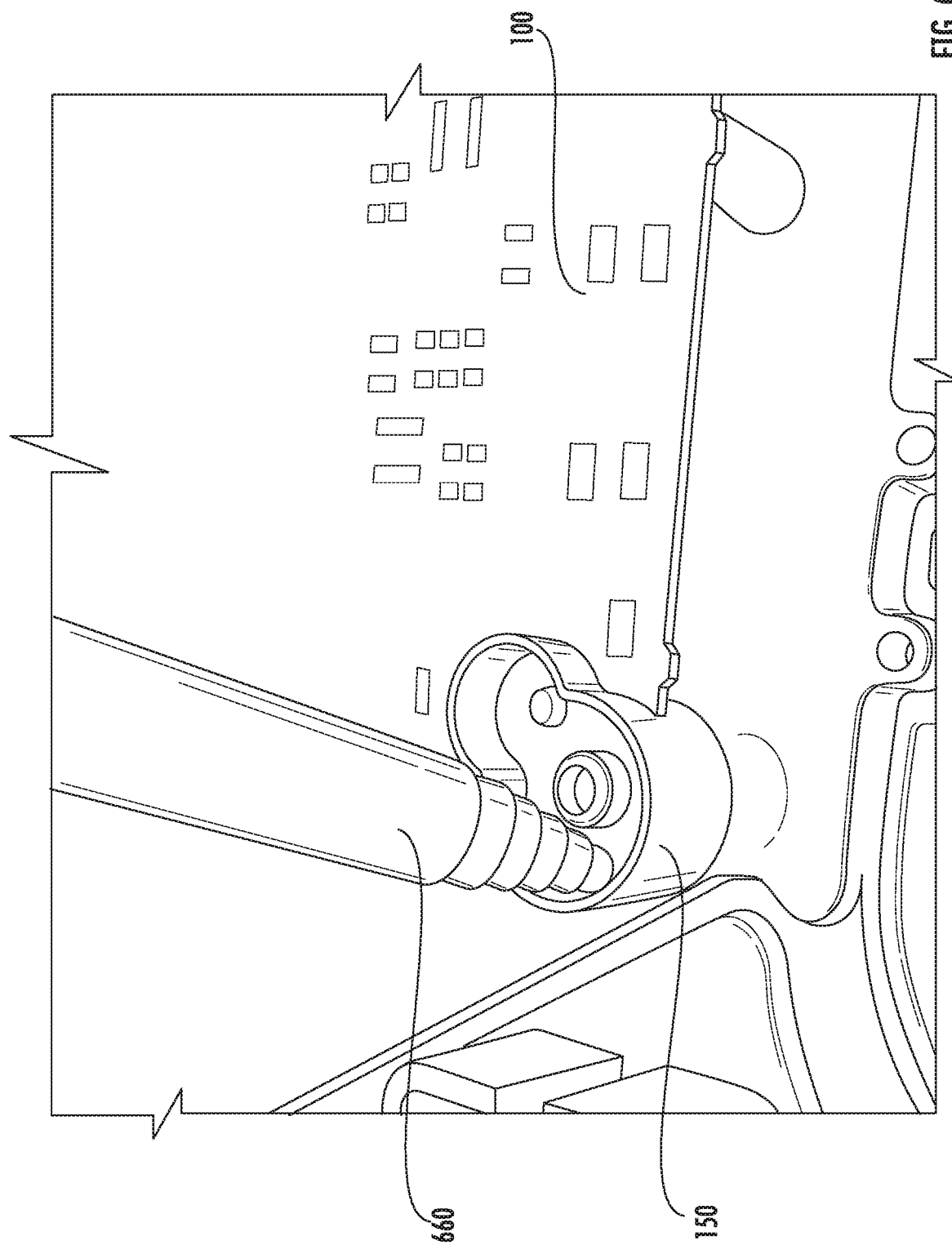
Figure 7:
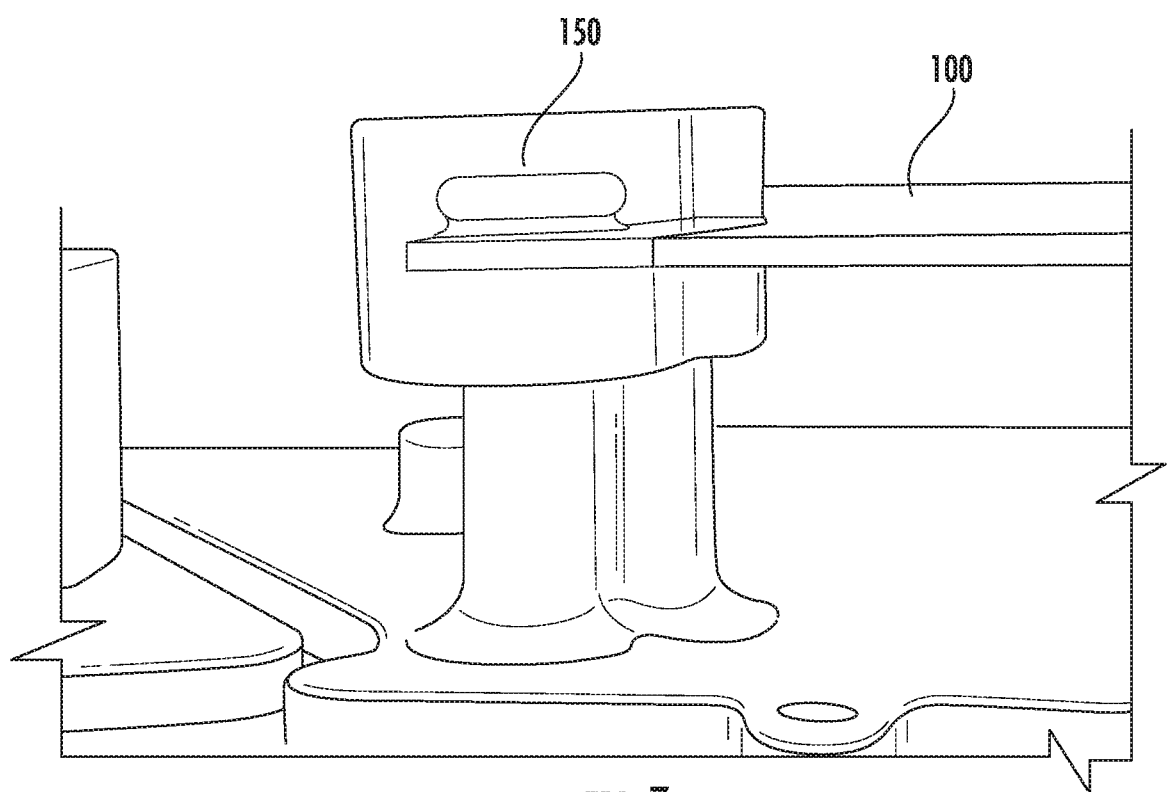
Figure 8:
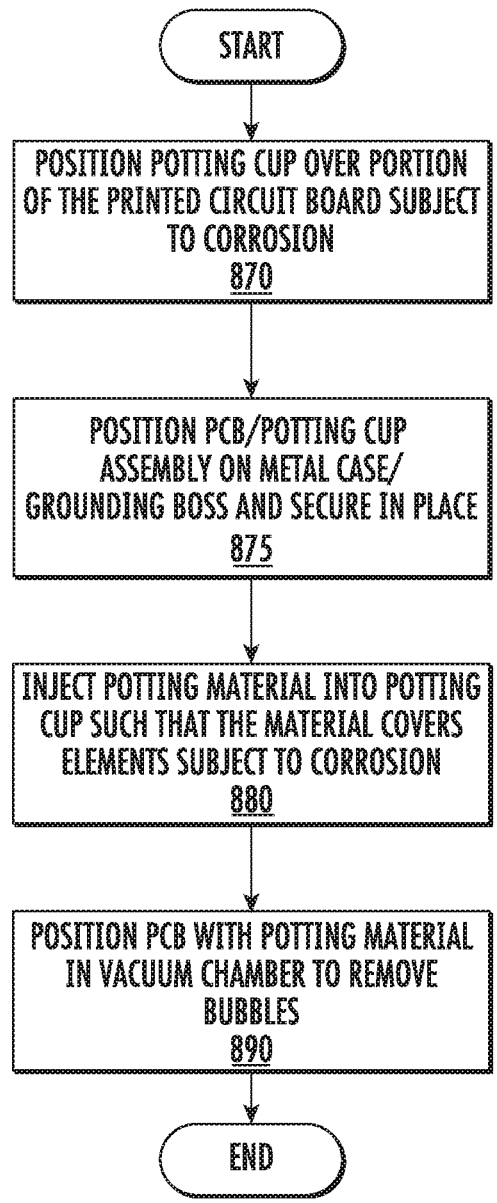
FIG. 8 is a flowchart illustrating operations for applying the potting material to the printed circuit board in accordance with some embodiments of the present inventive concept.

Referring now to FIGS. 5 through 8, application of the potting material will be discussed. As illustrated in FIGS. 5 and 8, the potting cup 150 is positioned on the PCB 150 to encapsulate the elements subject to corrosion, for example, the screw and alignment pin (block 870). The PCB/potting cup assembly may then be positioned on the metal case/grounding boss and secured thereto using, for example, screw in the appropriate position (block 875). As illustrated in FIGS. 6 and 8, a potting material 660, for example, a silicon gel, is injected into the potting cup 150 (block 880). As discussed above, just enough material is injected to cover the elements subject to corrosion. Once injected, the potted PCB is place in a vacuum chamber to remove any air bubbles that may be present in the injected material (block 890). FIG. 7 illustrates the potted PCB upon completion of the application process.

Referring now to the table of FIG. 9, tests were performed designed to accelerate corrosion between electrical contacts using corrosive mixed gases similar twenty plus years of outdoor life that may be experiences by a device similar to those discussed herein. Referring to the column entitled "PCB Delta" illustrating the increase in resistivity (in ohms) from the pre testing VS post testing, the maximum increase in resistance was 0.001Ω. Thus, the results illustrate that selective potting in accordance with embodiments discussed herein is effective in reducing corrosion among elements subject thereto.

Figure 10:
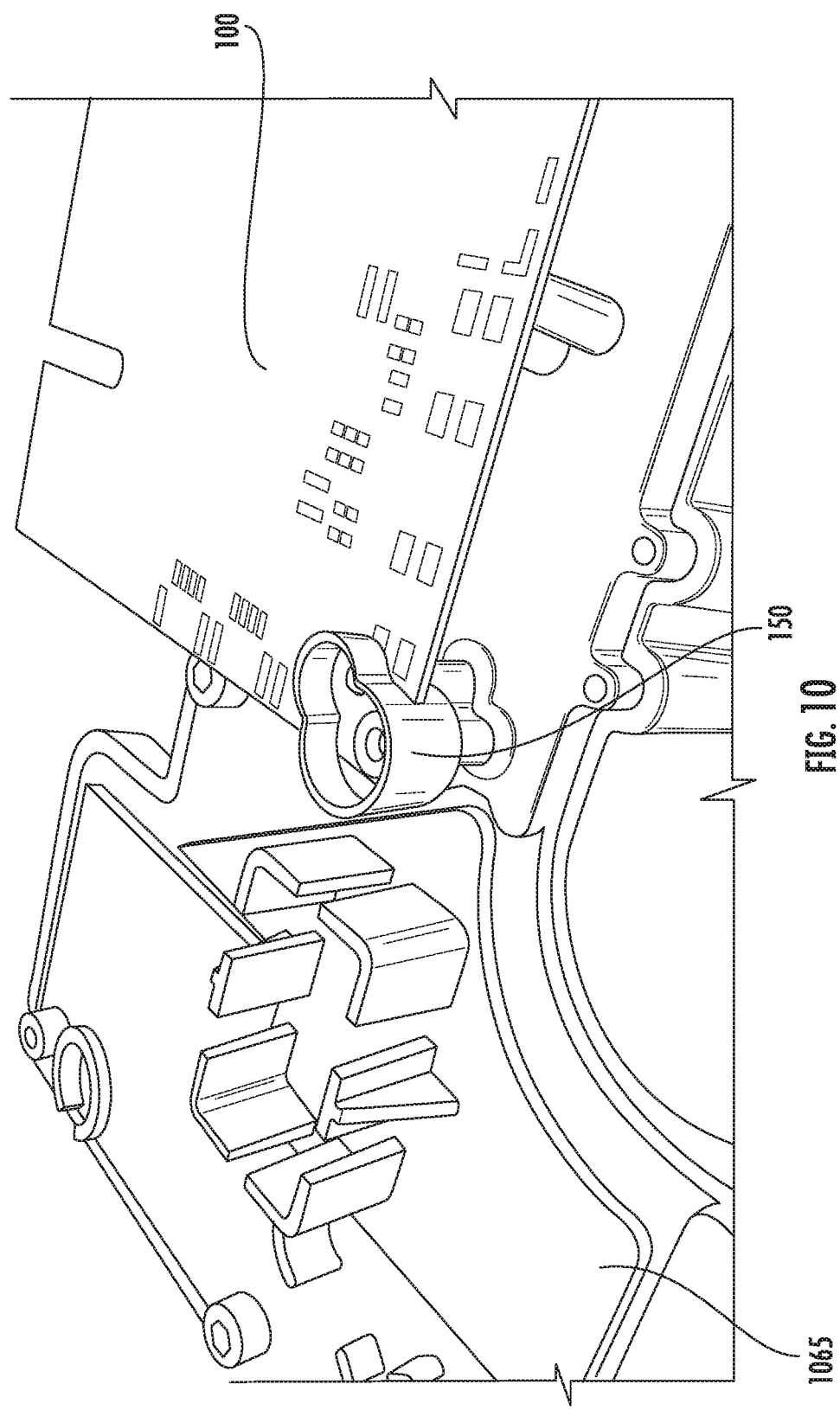
FIG. 10 illustrates a printed circuit board having a potting cup thereon, the printed circuit board being coupled to a meter in accordance with some embodiments of the present inventive concept.

FIG. 10 illustrates a PCB 100 in accordance with embodiments herein coupled to a device 1065, for example, an ultrasonic gas meter. As illustrated, the PCB 100 includes a potting cup 150 as discussed herein.

As briefly discussed above, embodiments of the present inventive concept may provide PCBs with improved radio communications signals that are still able to withstand corrosive environments for the life of the device. In particular, using a selective potting process made possible with potting cups discussed herein to direct the potting material to portions of the PCB may allow a consistent ground path from the PCB ground plane to an aluminum case of an ultrasonic gas meter to be maintained such that both radio and gas metrology performance is consistent over the course of, for example, twenty years in an outdoor environment.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A potting cup positioned on a printed circuit board, the potting cup encapsulating only a portion of the printed circuit board including at least one interface subject to corrosion when exposed to moisture and configured to receive a potting material in the encapsulated portion to cover the at least one interface subject to corrosion, wherein the potting cup comprises a slot such that a portion of the potting cup is positioned directly over an upper surface of the printed circuit board and a portion of the potting cup is positioned directly below a lower surface of the printed circuit board.

2. The potting cup of claim 1, wherein the potting cup is configured to encapsulate the upper surface, the lower surface and edges of a single corner of the printed circuit board such that the potting cup wraps around the single corner of the printed circuit board.

3. The potting cup of claim 1:
wherein the at least one interface comprises a screw printed circuit board interface; and
wherein the potting material is provided at the interface between a screw head and an upper surface of the printed circuit board and a screw boss and a lower surface of the printed circuit board such that the potting material fully covers the screw head.

4. The potting cup of claim 3, wherein presence of the potting material on the at least one interface subject to corrosion provides a consistent ground path from a ground plane of the printed circuit board to a metal case of a device associated with the printed circuit board.

5. The potting cup of claim 1, wherein the potting cup is a plastic injection molded potting cup.

6. The potting cup of claim 1, wherein the potting cup is one of a translucent and clear plastic material.

7. The potting cup of claim 1, wherein the potting material comprises a silicone gel.

8. The potting cup of claim 1, wherein, when positioned on the printed circuit board, the potting cup comprises a space between surfaces of the printed circuit board and the potting cup to allow air to escape during application of the potting material, wherein the space between the surfaces is provided by the slot.

9. The potting cup of claim 1, wherein the printed circuit board is positioned in an ultrasonic gas meter that includes a radio communications module therein.

10. A method for potting a selected portion of a printed circuit board, the method comprising:
positioning a potting cup on a printed circuit board such that the potting cup encapsulates only a portion of the printed circuit board including at least one interface subject to corrosion when exposed to moisture, wherein the potting cup comprises a slot such that portion of the potting cup is positioned directly over an upper surface of the printed circuit board and a portion of the potting cup is positioned directly below a lower surface of the printed circuit board;
injecting a potting material into the potting cup positioned on the printed circuit board to cover the at least one interface subject to corrosion; and
removing air bubbles from the injected potted material using a vacuum chamber.

11. The method of claim 10, wherein the potting cup is configured to encapsulate the upper surface, the lower surface and edges of a single corner of the printed circuit board such that the potting cup wraps around the edges of the single corner of the printed circuit board.

12. The method of claim 10:
wherein the at least one interface comprises a screw printed circuit board interface; and
wherein injecting the potting material comprising injecting the potting material at the interface between a screw head and an upper surface of the printed circuit board and a screw boss and a lower surface of the printed circuit board such that the potting material fully covers the screw head.

13. The method of claim 12, wherein presence of the potting material on the at least one interface subject to corrosion provides a consistent ground path from a ground plane of the printed circuit board to a metal case of a device associated with the printed circuit board.

14. The method of claim 10, wherein the potting cup is a plastic injection molded potting cup.

15. The method of claim 10, wherein the potting cup is one of a translucent and clear plastic material.

16. The method of claim 10, wherein the potting material comprises a silicone gel.

17. The method of claim 10, wherein, when positioned on the printed circuit board, the potting cup comprises a space between surfaces of the printed circuit board and the potting cup to allow air to escape during application of the potting material, wherein the space between the surfaces is provided by the slot.

18. The method of claim 10, wherein the printed circuit board is positioned in an ultrasonic gas meter that includes a radio communications module therein.

19. The potting cup of claim 1, wherein the slot is contiguous around the upper and lower surfaces of the printed circuit board.

\* \* \* \* \*